(12) United States Patent
Maggiali et al.

(10) Patent No.: US 9,354,703 B2
(45) Date of Patent: May 31, 2016

(54) TACTILE CONTROL ARRANGEMENT FOR ELECTRICAL OR ELECTRONIC DEVICES INTEGRATED IN A TEXTILE SUPPORT

(75) Inventors: Marco Maggiali, Lavagna (IT); Giulio Sandini, Genoa (IT); Marcello Bottino, Recco (IT)

(73) Assignees: FONDAZIONE ISTITUTO ITALIANO DI TECNOLOGIA, Genoa (IT); ORANGE S.R.L., Genoa (IT)

( * ) Notice: Subject to any disclaimer, the term of this patent is extended or adjusted under 35 U.S.C. 154(b) by 0 days.

(21) Appl. No.: 14/411,196

(22) PCT Filed: Jun. 26, 2012

(86) PCT No.: PCT/IB2012/053230
§ 371 (c)(1),
(2), (4) Date: Dec. 24, 2014

(87) PCT Pub. No.: WO2014/001843
PCT Pub. Date: Jan. 3, 2014

(65) Prior Publication Data
US 2015/0301603 A1  Oct. 22, 2015

(51) Int. Cl.
*G06F 3/01* (2006.01)
*G06F 3/044* (2006.01)
(Continued)

(52) U.S. Cl.
CPC ............... *G06F 3/016* (2013.01); *G06F 3/044* (2013.01); *G06F 3/0416* (2013.01);
(Continued)

(58) Field of Classification Search
None
See application file for complete search history.

(56) References Cited

U.S. PATENT DOCUMENTS 6,155,841 A  12/2000 Spanyar

| 2006/0147678 | A1* | 7/2006 | Marmaropoulos | H03K 17/9505 428/172 |
|---|---|---|---|---|
| 2007/0248799 | A1 | 10/2007 | DeAngelis et al. | |
| 2011/0018556 | A1* | 1/2011 | Le ........................ | H03K 17/955 324/654 |

FOREIGN PATENT DOCUMENTS

| CN | 1940513 A | 4/2007 |
|---|---|---|
| WO | 03052541 A2 | 6/2003 |

(Continued)

OTHER PUBLICATIONS

International Search Report dated Apr. 5, 2013.

*Primary Examiner* — Kenneth B Lee, Jr.
(74) *Attorney, Agent, or Firm* — Thomas Horstemeyer, LLP

(57) ABSTRACT

A tactile control arrangement (10) for at least one electronic device (W, P) including a touch control interface (12) based on a capacitive sensor matrix (S) and a electronic processing module (16) associated to the sensor matrix (S) and arranged to receive therefrom a plurality of electrical signals indicative of the touch or the pressure of an external body on at least one sensor (S) of the matrix and consequent commands to be transmitted towards the above-mentioned electronic device (W, P) is described. The sensor matrix (S) comprises a plurality of active sensor electrodes (E) and a corresponding plurality of conductive tracks (T) for the connection of the active electrodes (E) with the processing module (16). The sensor matrix (S) is formed by a plurality of flexible functional layers (32-48) including a first layer (32) of conductive elastomeric material forming the active electrodes (E) and a second layer (42) of conductive elastomeric material forming the conductive tracks (T) on a plane parallel to the layer (32) of active electrodes (E), which first and second layers (32, 42) of conductive elastomeric material are separated by a flexible layer (40) of insulating material comprising a non-conductive fabric bearing a plurality of vias at the active electrodes (E) of the first layer (32) and the corresponding conductive tracks (T) of the second layer (42), wherein the layers (32, 42) of active electrodes (E) and conductive tracks (T) are deformed so as to directly contact through the vias of the non-conductive textile layer (40).

19 Claims, 4 Drawing Sheets

(51) Int. Cl.
*H03K 17/96* (2006.01)
*G06F 3/041* (2006.01)
*G06F 1/16* (2006.01)

(52) U.S. Cl.
CPC ........... *H03K 17/9622* (2013.01); *G06F 1/163* (2013.01); *G06F 2203/04102* (2013.01); *G06F 2203/04107* (2013.01); *H03K 2017/9602* (2013.01); *H03K 2217/94094* (2013.01)

(56) References Cited

FOREIGN PATENT DOCUMENTS

| | | | |
|---|---|---|---|
| WO | 2005000052 | A2 | 1/2005 |
| WO | 2005096133 | A1 | 10/2005 |
| WO | 2008085589 | A1 | 7/2008 |
| WO | 2010034166 | A1 | 4/2010 |

\* cited by examiner

TACTILE CONTROL ARRANGEMENT FOR ELECTRICAL OR ELECTRONIC DEVICES INTEGRATED IN A TEXTILE SUPPORT

The present invention relates to tactile sensors, and more particularly to a tactile arrangement integrated in a flexible support for the control of electrical or electronic devices. More particularly, the invention relates to a tactile arrangement integrated in a textile support for the control of portable or wearable devices.

Nowadays, people interact with a number of electrical and electronic devices they wear, carry with them or in the proximity of which they are, while performing everyday actions. Consider, for example, devices such as watches, telephones, and portable music readers that many people have with them in any moment of the day, or more sophisticated navigation tools that many carry with them during travels or excursions. In a working setting, the technicians who are called to intervene for the maintenance of plants, and surveillance or rescue operators (for example, law enforcement professionals, health professionals, fire brigades) are equipped with emergency communication devices often integrated into their item of clothing, in order to be always available in any operative condition. Even in the medical field, the use has become firmly established of control and alarm electronic devices, which are wearable by patients or by subjects at risk, through which it is possible to monitor one's own state of health and send alarm messages on an automated basis or voluntarily, through a button or—in more complex devices—a keyboard.

In the automotive field, vehicles are equipped with communication and entertainment devices with which the driver, and also preferably the passengers, can interact, generally through voice or manual commands, by acting on control buttons, levers or selection dials arranged on the steering wheel or the dashboard.

Finally, in domestic settings, not only the communication and entertainment apparatuses, but also the systems and appliances can be controlled through one or more remote controls, each of which is integrated in a hand-holdable device that the user can have within grasp in order to promptly issue the desired management commands whenever necessary.

Unfortunately, the known devices, although integrated into an item of clothing or a wearable accessory, provide for the need of a tactile control interface that is external to the usually rigid support, which due to its configuration can be an hindrance or be poorly ergonomically designed.

WO 2005/96133 discloses a tactile sensor which may be integrated on textiles, for example, for clothing or furniture, made in the form of a stratified device comprising two conductive textile layers between which a third layer of non-conductive textile material is interposed, coated with a piezoresistive material, for example in the form of a matrix of separate areas, to which allows the connection between the conductive layers through the regions in which the piezoresistive material is not present.

WO 2005/00052 has as its object a flexible interface for a textile item of clothing or a coating or upholstery. The interface comprises a plurality of regions in conductive elastomeric material adapted to generate the control signals of associated electronic interface devices or systems, and has a plurality of contact areas producing a multitude of different control patterns for a variety of applications.

CN 1940513 has as its subject a touch-sensitive item of clothing for a smart robot, in which the sensor unit is composed of electrode plates, respectively upper and lower, each of which has a corresponding matrix of electrode contacts, respectively organized into rows and columns. Between the corresponding electrode contacts of the two plates, an electrically conductive rubber with piezoresistive properties is arranged. A separation and insulation coating between the electrode plates, suitably perforated to allow for the arrangement of the conductive rubber elements, is arranged for maintaining the adjacent electrode contacts spaced apart. An external protective layer can be used for the fabric coating of the robot.

Among the patent documents of the prior art with reference to the functional aspects of a tactile sensor wearable by a user, US 2010/0219943 discloses a wrist watch provided with a tactile sensor of a capacitive type, made on a substrate of flexible material that allows for different configurations thereof, and particularly it teaches how to produce a device with tactile detecting circuits distributed throughout the length of the bracelet in the form of buttons or virtual keys, adapted to create a plurality of commands of applications.

WO 2008/085589 discloses a sensor platform adapted to be worn and controlled by a user for the control of a separate radio communication terminal, for example, worn by the same person.

Finally, US 2008/05527 relates to the manufacture of switches and devices adapted to be used in flexible articles, such as textile products or the like, in which the flexible electrical contacts are made of silicone or flexible conductive rubber, adapted to be deformed to contact a layer of conductive tracks, also flexible, incorporated in a coating layer and exposed at the contact points. The layer with conductive tracks can be made of conductive fabric, of a fabric printed with conductive tracks, or as a flexible printed circuit board produced on a polymer film.

The present invention has as its object to provide a solution for the fabrication of a high-efficiency tactile control arrangement, that is practical and at the same time robust, which lends itself to a full integration with any type of textile or anyhow flexible support, and particularly items of clothing or wearable accessories, or hand-holdable equipment.

According to the present invention, such an object is achieved by virtue of a tactile control arrangement having the characteristics as set forth in claim 1.

Particular embodiments are the subject of the dependant claims, the content of which is to be meant as an integral part of the present description.

Furthermore, a flexible article, an equipment, and an item of clothing as claimed are the subject of the invention.

In brief, the present invention relates to the implementation of a control system for electronic devices comprising a user interface of the tactile type, which includes a completely flexible sensor arrangement. The tactile control arrangement is formed by an alternated stratification of conductive elastomeric films and non-conductive textile layers, forming a sensor matrix comprising a plurality of sensor electrodes and corresponding conductive tracks, and on the whole confer a high degree of flexibility of the arrangement, which makes it adapted to be integrated on textile or anyhow deformable supports, without significantly stiffening the support receiving it. The properties of the materials composing the layers of the sensor matrix allow the implementation of electrodes and conductive tracks electrically connectable together by direct contact through vertical non-metalized vias, whereby a control arrangement is implemented, starting from layers of foil material that can be easily configured without complex additional processing operations.

The tactile control arrangement that is the subject of the invention implements a device that is flexible and has a limited thickness, characterized by a substantially flat surface, i.e., free from buttons, reliefs, or three-dimensional elements, and arranged to be touched with one or more fingers of a user in order to impart also complex gestural commands, to a group of electronic devices connected therewith by means of cables or a wireless network.

Furthermore, the tactile control arrangement that is the subject of the invention has dimensions, shape, and mechanical characteristics allowing it to be incorporated within conventional items of clothing so as to 'functionalize' a portion thereof. In this manner, it is sufficient that a user touches with hisher fingers the surface of the item of clothing at the control arrangement to impart a command according to a simple and intuitive language, adaptable to different supports and use conditions.

Further characteristics and advantages of the invention will be set forth in more detail in the following detailed description of an embodiment thereof, given by way of not-limiting example, with reference to the accompanying drawings, in which.

Figure 1:
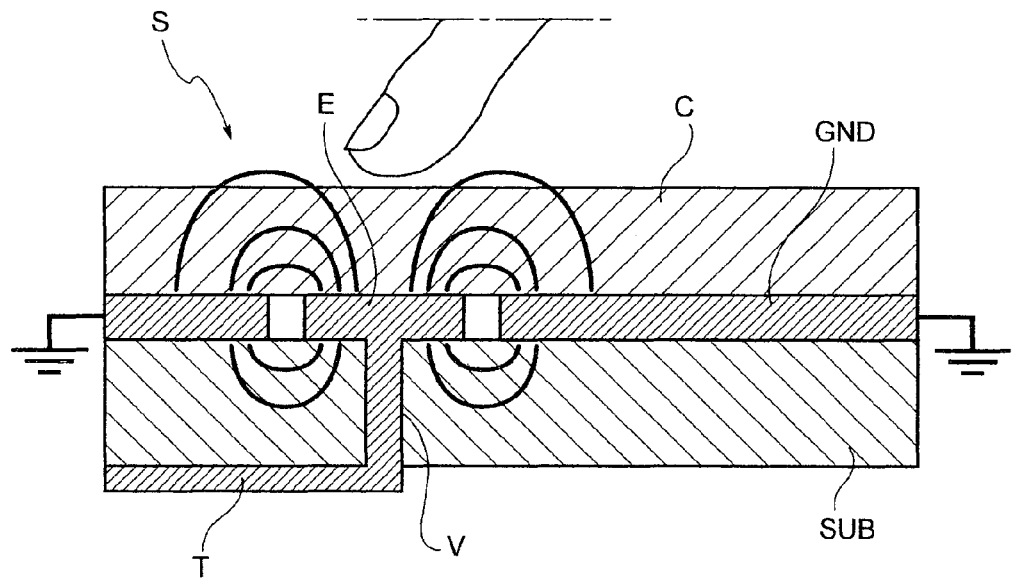
FIG. 1 is a schematic representation of a capacitive tactile sensor according to the prior art.

In FIG. 1 a schematic sectional view is shown, of a model of capacitive tactile sensor S based on the architecture of a planar capacitor, which comprises a substrate SUB, on a top area of which a central active electrode E and a reference conductor which surrounds the active electrode E, and from which the active electrode is separated by means of a uniform gap, are made. In a common embodiment, the reference conductor is maintained at a ground potential GND, and a dispersed electric field is established between the electrode E and the reference conductor, represented by the curve field lines shown in the Figure. In an implementation variation, herein preferred and represented in FIG. 3, the conductor surrounding the active electrode E does not act as a reference conductor, but a shielding alternating voltage AC_SHIELD is applied thereto, and an electrical field is established between the electrode E and an external subject approaching it, whereby the field lines close towards ground through the subject. A via V in the substrate SUB connects the active electrode E of the sensor with a conductive track T obtained on the opposite side of the substrate. A coating and protective layer C is deposited on the upper face of the substrate SUB and encapsulates the active electrode and the ground conductor. Optionally, a further coating and protective layer (not shown) can be provided on the opposite face of the substrate to protect the conductive tracks.

The presence of a body, for example a user's finger, in the proximity of (in contact with) the active electrode, perturbates the electrical field, and thus the capacitance of the capacitor defined by the active electrode E. This perturbation can be detected by a per-se-known transducer circuit, typically integrated in a microcontroller, connected to the conductive track T and adapted to detect a variation in an electrical quantity characteristic of the system. Such variation is indicative of the presence of a body (touch) and the intensity of the contact (pressure).

An array of capacitive tactile sensors S can be implemented on a detection area having the desired shape and extent, and it is controlled by a single management integrated circuit arranged in the proximity thereof, or remote. The structure of the planar tactile sensors of the capacitive type, as well as the architecture of the associated conditioning electronics, the physical phenomena on which their operation is based, their applications, is well known in the art, and it will be not further described herein.

Figure 2:
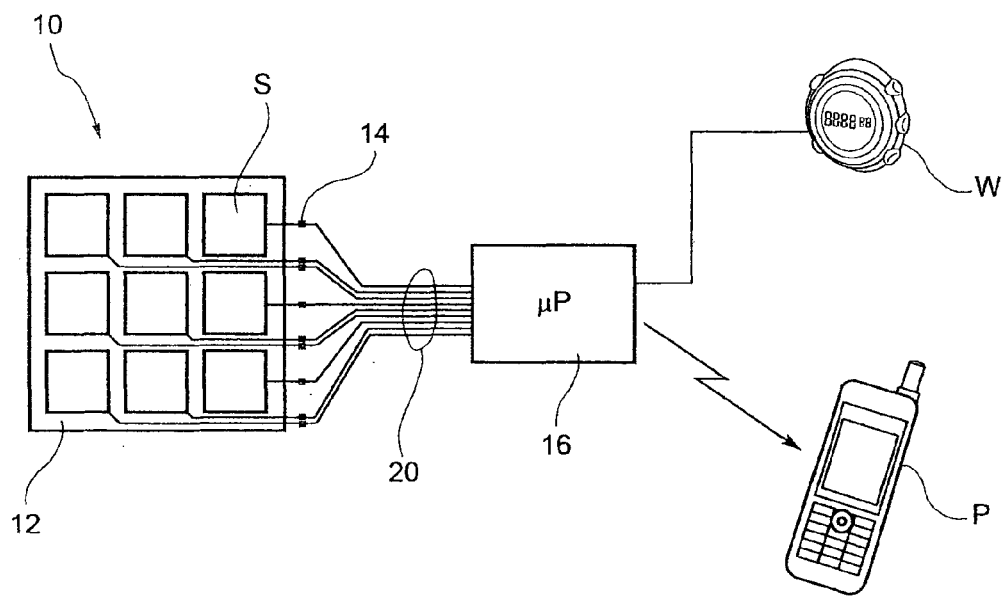
FIG. 2 is a diagram of a system for the control of electronic devices comprising a tactile control arrangement that is the subject of the invention.

A system for the control of electronic devices comprising a tactile control arrangement that is the subject of the invention is shown in FIG. 2.

A tactile control arrangement is indicated with 10, including a matrix of capacitive tactile sensors S of the type described with reference to FIG. 1, integrated in a flexible pad 12, having a preferably rectangular area. The sensor matrix has a corresponding plurality of contacts 14 for the connection with an external processing circuit module 16, for example, a microcontroller arranged for the acquisition and processing of the signals emitted by each sensor S. Advantageously, the connection of the contacts 14 with the processing module 16 is implemented by means of a multipolar planar conductor strip 20, which is also flexible, while the processing module can be implemented by a traditional technology for hybrid circuits on rigid printed circuit support, or also on flexible supports (flex-PCB). This solution allows to place the control electronics in a remote position with respect to the sensitive part, which is housed in a safe position within a small rigid container, without in any way compromising the flexibility and conformability characteristics of the sensitive part. The control electronics can possibly be separated from the sensitive area, by decoupling the connection by means of the multipolar strip 20, or be permanently separated and connected via radio, provided that an antenna and associated supply and driving electronics are implemented on board of the sensor matrix.

The sensor matrix is represented by way of example only as a rectangular matrix, comprising a plurality of sensors aligned in rows and columns. However, this arrangement is to be meant as not limiting, also alternative linear or two-dimensional arrangements being able to be made, having shapes and extensions that are compatible with the intended use of the tactile control arrangement that is the subject of the invention.

The multipolar strip 20 for the connection between the sensor matrix and the processing module bears a bundle of lines of excitation and reading of sensors, an optional ground connection line, and an AC voltage shielding connection line AC_SHIELD.

The microcircuit of the processing module 16 is, for example, a chip AD7147 by Analog Device, configured and programmed to generate an excitation signal of the sensors, for example, a square wave signal voltage at a frequency of 250 kHz, applied to the active electrodes of the sensor devices through the conductive tracks and the vertical connection vias, and for acquiring the voltage signals (reading of the voltage drop) that are established at the electrodes, indicative of the data of analog contact (capacitive) measurements, through the same conductive tracks. With the arrangement of a matrix of 12 sensors, the microcircuit is adapted to provide 16-bit data indicative of 12 capacity measurements, which it provides by serial data communication bus (I2C or SPI), for example, to an external cabled communication line or an antenna arranged for a radio connection with remote devices.

The processing module 16 is arranged to be coupled to one or more electronic devices in the proximity, for example, portable personal electronic devices, such as a telephone P and a watch W, via cable, or via radio. Further examples of electronic devices adapted to be controlled by the tactile control arrangement that is the subject of the invention comprise navigation tools, emergency communication devices integrated in professional items of clothing, control and alarm electronic devices in the medical field that are wearable by patients or subjects at risk, but also communication and entertainment devices on board of vehicles and, in domestic settings, communication and entertainment apparatuses, systems, and appliances, or their associated hand-holdable remote control devices.

The processing module 16 is arranged to associate to each combination of signals of the sensor matrix (simultaneous or sequential), corresponding to a combination of pressure or touch events detected by the sensors, a predetermined different control function of an electronic device in the proximity, coupled therewith. To different pressure or touch combinations correspond different commands according to a preset language that a user can freely change by an interface software residing in a standard processor (personal computer).

Figure 3A:
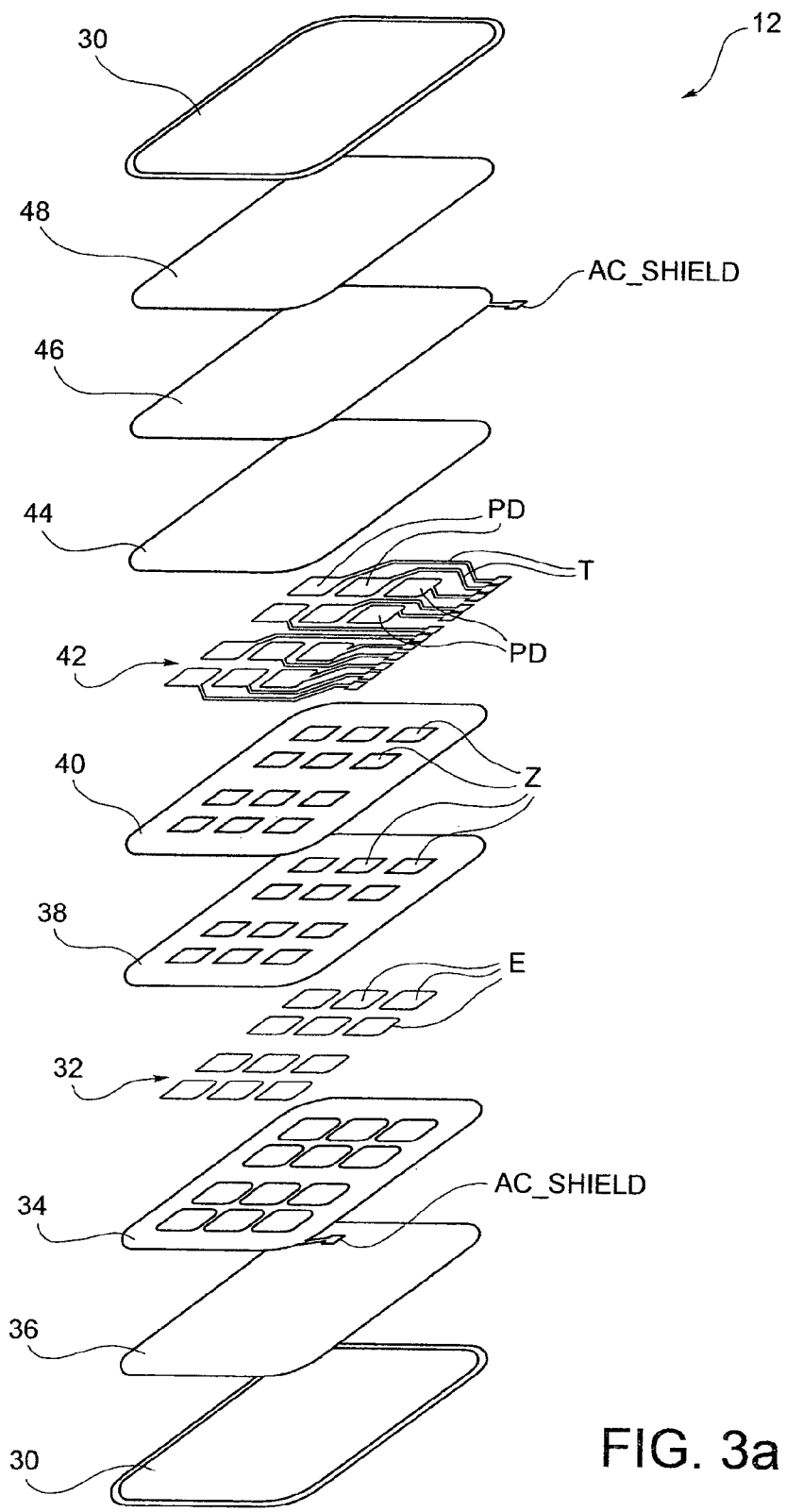
FIGS. 3a and 3b are exploded views of the layers that compose a tactile control arrangement according to two embodiments of the invention.

In FIG. 3a, a currently preferred embodiment of a flexible pad 12 integrating a matrix of capacitive tactile sensors S is shown.

The flexible pad 12 includes a plurality of layers, of conductive material and of insulating material, respectively, both being flexible, coupled together by gluing, which implement a planar capacitive sensor structure, having the property of easily fitting curve surfaces.

Between two outer textile layers 30, which compose an integral part of a textile support such as an item of clothing or use accessory of the tactile control arrangement, or the casing for such an arrangement, couplable by mechanical (sewing) or chemical (co-moulding) adhesion to the textile support, a sensor matrix S is arranged, comprising an array of pads 32, of a preferably square shape, forming the active electrodes E (in the example, 12 electrodes aligned in rows and columns) and a conductor shielding foil 34, provided with a conductor terminal for the connection to a shielding alternating voltage AC_SHIELD between the sensors of the matrix. The conductor shielding foil 34 has a corresponding number of openings or cutouts of similar shape to the shape of the pads of the electrodes and a greater area, adapted to house therein the electrode pads according to a planar arrangement.

One face of the pads 32 and the foil 34 is connected with a first textile layer 30 by means of an adhesive material layer 36.

On the opposite side, the pads 32 and the foil 34 are preferably, but not necessarily, connected by means of a film 38 of a similar adhesive material, with an insulating material foil 40, for example a foil of the same fabric composing the external casing layers. The adhesive material layer 38 and the insulating material foil 40 are of a congruent shape, and both have a series of openings or cutouts Z at the pads of the electrodes, of a similar shape thereto and a smaller area. Alternatively, only the adhesive material layer 38 can be provided, acting also as an insulating layer.

On the opposite side of the insulating fabric foil 40 or the adhesive material layer 38 with respect to the configuration of electrodes 32, a layer 42 of conductive material is arranged, which is shaped to create a plurality of separated conductive regions, each forming a contact pad PD arranged at an active electrode E of the array of sensors S and a corresponding conductive track T, ending with an enlarged contact area for the connection with the external processing circuit module 16 arranged for the acquisition and processing of the signals from each sensor S.

By virtue of the tight packing of the pad 12 between the external textile layers 30, the contact pads PD of the layer 42 come into direct contact with the electrode pads 32 on the opposite side of the insulating layer 40, without the need to build a metalized via orthogonal thereto for the production of the sensor.

The conductive regions of the layer 42 are connected by means of an insulating adhesive layer 44 to a conductive material layer 46 with a shielding function, provided with a conductor terminal for the connection to the shielding alternating voltage AC_SHIELD.

Advantageously, the conductive layers 46 and 34 perform the shielding function between adjacent sensors, preventing the signal detected by a sensor from propagating as a disturbance to the sensors near to it.

Finally, a face of the conductive shielding layer 46 is connected to a second textile layer 30 by means of an adhesive material layer 48, optionally interposing an additional conductive layer connected to a reference potential, for example, to ground.

Figure 3B:
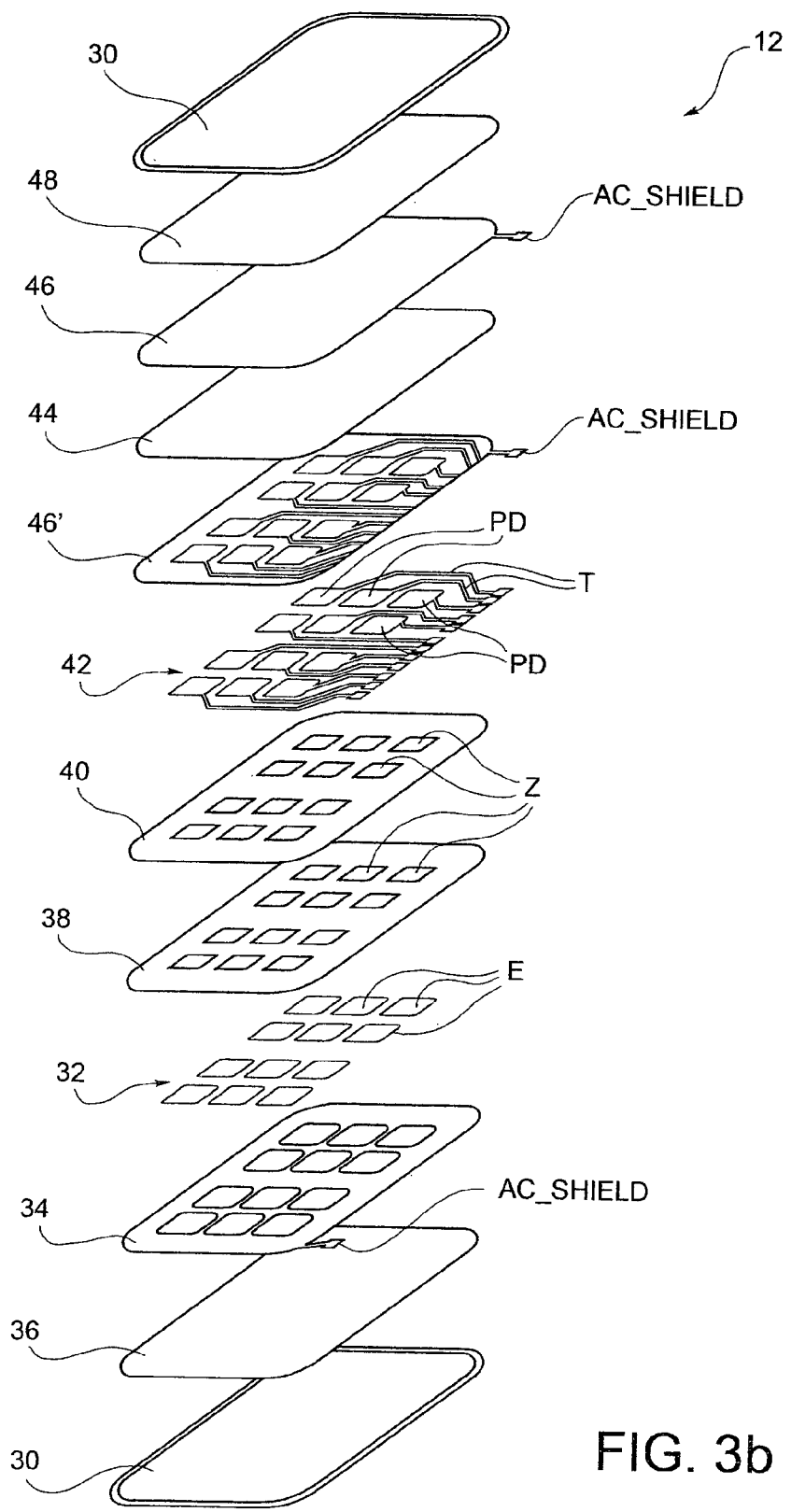

Alternatively, as shown in FIG. 3b, the conductive regions of the layer 42 can be surrounded by a co-planar conductive adhesive material layer 46', provided with a conductor terminal for the connection to the shielding alternating voltage AC_SHIELD, and thus having a shielding function, and both the layers are connected with the second textile layer 30 through the insulating adhesive layer 44, the shielding layer 46, and the adhesive layer 48.

The external textile layers 30 preferably have a larger extension than the inner layers, so as to define a connecting flap with an item of clothing or accessory by sewing or co-molding.

In the area of the tactile sensor matrix, the casing has not only a protective function, but also a functional one. In this area, the used materials form the dielectric of the touchpad, from the mechanical and electrical properties of which the response characteristic of the arrangement that is the subject of the invention originates.

The sensor matrix according to the invention can be made in an improved form that is enhanced with pressure detection functions, if a locally deformable soft layer of insulating material and a ground connectable layer (GND) are arranged between the layers 36 and 30, whereby it is possible to make a control arrangement having an additional operative mode for the measurement of the pressure exerted by any external objects, whether conductive or not, on the surface of the flexible pad 12.

In this improved embodiment, the microcircuit of the processing module 16 is arranged to acquire the voltage signals that are established at the electrodes E and are indicative of the capacity variation representative of the pressure exerted on the corresponding sensors, through the same conductive tracks T defined by the layer 42.

In a preferred embodiment, the external textile layers are of a soft material, for example, ladder-proof stretch fabric; leathers, including synthetic; furniture or clothing textiles, protective or special technical textiles, and the insulating material layers are made of a ladder-proof stretch fabric formed by a composition comprising 5 to 30% by weight elastomer (for example, a known elastomeric fiber under the trade name Lycra) in a matrix of polyamide and/or polyester, and for a weight of the order of 150-200 g/m$^2$. This confers elasticity and return upon release of stresses to the fabric. The conductive layers are layers made of conductive synthetic rubber based on acrylonitrile-butadiene (NBR), with added carbon black NBR 80°-85°, which has a controlled resistance, of less than 40 ohms/cm, and an approximate thickness of 1 mm. The adhesive layers are formed from a film or deposition of thermoplastic polyurethane (hot melt) adhesive, for example, an ester and polyurethane composition having a thickness of about 100-150 microns.

For the implementation of the tactile control arrangement described herein, a very high precision is necessary when processing the materials, particularly in the cutting, centering, and aligning operations between the insulating textile layers and the conductive rubber layers, which—being extremely flexible materials at the operating temperatures—if they are not treated in an excellent manner, tend to change their dimensions during the process, which necessarily is a hot process.

The various layers are cut with a laser cutting technique to obtain a very high accuracy, and hot glued by means of presses that, by means of heat and pressure, permanently glue the layers together. This type of gluing ensures the wear resistance, vibration resistance, water and solvent resistance, elasticity, and strength characteristics of the piece. Subsequently, other materials/textiles can be glued or sewed on the so-formed flexible pad, to meet the more varied needs for the final product.

The use mode of the tactile control arrangement according to the invention is through touch and pressure actions of areas of the flexible pad 12, corresponding to the matrix of sensors. The areas at which the active electrodes of the sensor matrix S are buried are preferably marked with pictograms or symbols indicative of the function associated with the corresponding control.

Figure 4:
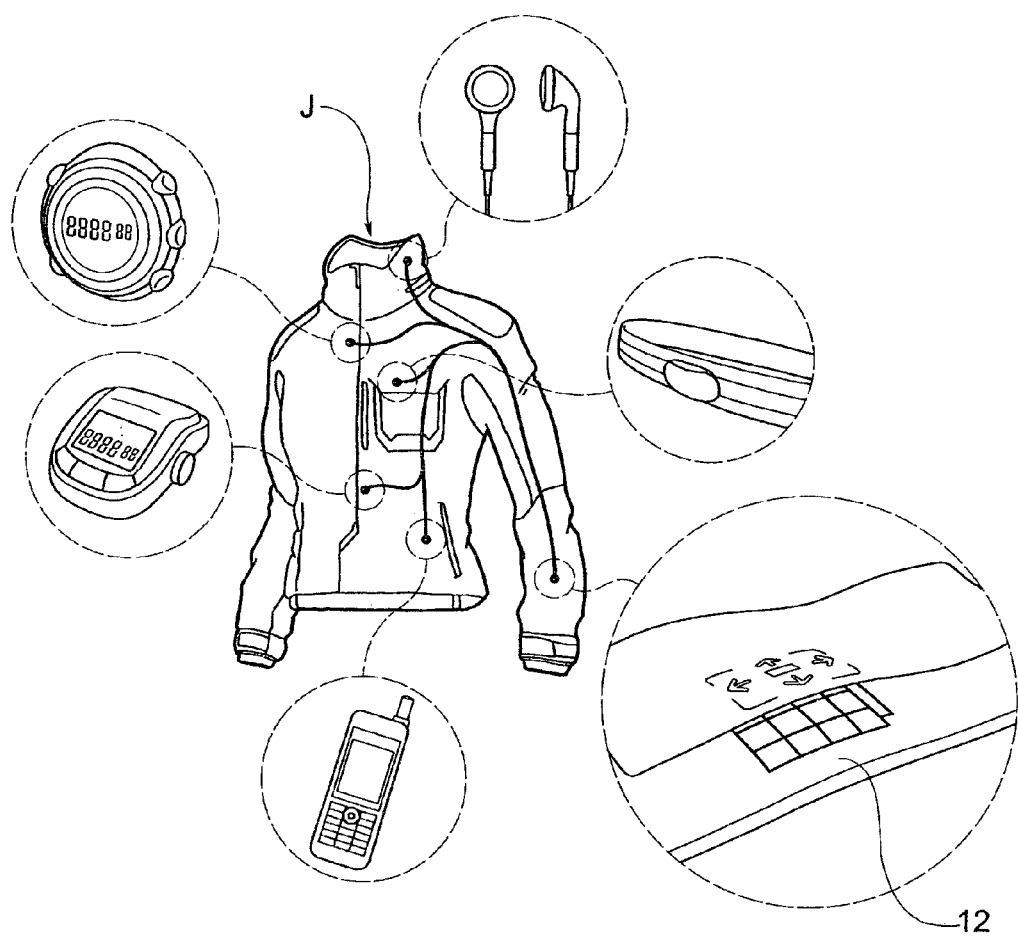
FIG. 4 is a general view of an application example of the tactile control arrangement that is the subject of the invention.

When the pad 12 of the control arrangement Is touched, for example, when a subject presses on top of a sensor, it changes the flow lines of the electrical field established between the electrodes and the part of the body in contact with the sensor and the dielectric surrounding the matrix of electrodes is subjected to a perturbation, corresponding to a variation of the rated capacity of the sensor next to the area affected by the pressure or touch. Such capacity variation provides information both on the extent of the pressure exerted on the pad, and on the spatial distribution of the same. In this way, it is possible to detect the intensity, duration, and extent of the touch by the user. The acquisition and processing electronics of the electrical signal generated by the sensor matrix translates the command to the associated electronic device. An example is shown in FIG. 4, of the use of the arrangement according to the invention for the management of multiple electronic personal devices which a subject carries with him/her, tied to his/her body or kept in pockets of a jacket J, of which, a smartphone, a radar, a watch, a pair of headphones, a chest strap are illustrated from bottom to top on the left and clockwise, via the flexible control interface shown in the lower right corner, where a fabric flap is raised to show the schematized sensor matrix. The flexible interface is integrated in a fabric area of the jacket J, at the end of a sleeve where it is easily reachable by a hand of the user. The illustrated electronic devices are connected to the interface, through wire connections (shown in the Figures by the solid lines that run to through the jacket J), or via radio.

Advantageously, the tactile control arrangement according to the invention is soft and flexible, whereby it may easily be integrated in products made of or covered with fabric, including items of clothing, especially for sports clothing, clothing accessories (for example, backpacks), and sports equipment, and it is exploitable for the control of electronic devices and appliances for professional or entertainment use (for example, for military or medical uses). Instruments such as, for example, a sports watch, a GPS navigator, a chest strap for the determination, of the heartbeat, a portable phone, a digital sound reader, and any other tool, commercially available and arranged to be controlled by a central control device both through an electrical connection, and through a standard wireless communication protocol, can be associated thereto. The same technology can also be used for the detection of the localized and/or distributed pressure on shapes in a textile support, which will be able to be used on sports equipment, such as shoes, seats, saddles, rugs, or safety and control apparatuses, where information on pressure or weight is needed (for example, pressure gauges for medical use, scales, or shoulder straps of wearable backpacks and bags).

Of course, notwithstanding the principle of the invention, the embodiments and the constructive details may be widely varied with respect to what has been described and illustrated by way of not-limiting example only, without for this departing from the protection scope of the invention defined by the appended claims.

The invention claimed is:

1. A tactile control arrangement for at least one electronic device including a touch control interface based on a capacitive sensor array matrix and electronic processing means associated with said sensor matrix and arranged to receive therefrom a plurality of electrical signals indicative of the touch or the pressure by an external body on at least one sensor of the matrix and to process consequent commands to be transmitted towards said at least one electronic device,
wherein the sensor matrix comprises a plurality of active sensor electrodes and a corresponding plurality of conductive tracks for the connection of the active electrodes with the processing means,
characterized in that the sensor matrix is formed by a plurality of flexible functional layers including a first layer of conductive elastomeric material forming said active electrodes, and a second layer of conductive elastomeric material forming said tracks on a plane parallel to the layer of active electrodes, which first and second layers of conductive elastomeric material are separated by a flexible layer of insulating material comprising a non-conductive fabric bearing a plurality of vias at the active electrodes of the first layer and the corresponding conductive tracks of the second layer, wherein said layers of active electrodes and conductive tracks are deformed so as to directly contact through the vias of the non-conductive fabric layer.

2. The tactile control arrangement according to claim 1, wherein the sensor matrix is integrated in a stratified flexible pad between a pair of external textile layers, and includes a plurality of parallel layers connected together by glueing, which implement structures of capacitive planar sensors.

3. The tactile control arrangement according to claim 2, wherein said external textile layers are an integral part of a textile support of the tactile control arrangement, or the casing for such arrangement couplable by mechanical or chemical adhesion to the textile support.

4. The tactile control arrangement according to claim 1, wherein said sensor matrix includes at least one first layer of conductive shielding material connectable to a shielding alternating voltage (AC_SHIELD) source, comprising a plurality of cut-outs adapted to house the active electrodes therein according to an arrangement co-planar to said layer of active electrodes.

5. The tactile control arrangement according to claim 4, wherein said sensor matrix includes a second layer of conductive shielding material connectable to said alternating voltage (AC_SHIELD) source, arranged parallel to the layer of conductive tracks on the opposite side to the layer of active electrodes, and separated therefrom by an insulating layer.

6. The tactile control arrangement according to claim 4, wherein said sensor matrix includes a second layer of conductive shielding material connectable to said alternating voltage (AC_SHIELD) source, comprising a plurality of cutouts adapted to house the conductive tracks therein according to an arrangement co-planar to said layer of conductive tracks.

7. The tactile control arrangement according to claim 1, wherein the sensor matrix comprises an additional layer of insulating material locally deformable, coupled to said layer of active electrodes, and a conductive material layer connectable to a reference potential, whereby it is possible to build an arrangement of sensors adapted to detect the pressure exerted by an external body on the flexible pad.

8. The tactile control arrangement according to claim 2, wherein said external textile layers include neoprene.

9. The tactile control arrangement according to claim 1, wherein said insulating material includes a composition comprising 5 to 30% by weight elastomer in a polyamide and/or polyester matrix.

10. The tactile control arrangement according to claim 1, wherein said conductive material includes a synthetic conductive rubber based on acrylonitrile-butadiene (NBR), added with carbon black NBR 80°-85°.

11. The tactile control arrangement according to claim 2, comprising a thermoplastic adhesive, including an ester and polyurethane composition having a thickness of 100-150 microns between mutually glued layers.

12. The tactile control arrangement according to claim 1, wherein the sensor matrix has a corresponding plurality of terminal contacts of said conductive tracks for the connection to the processing means through a planar multipolar flexible strip of conductors, said processing means including hybrid circuits on a flexible printed circuit support.

13. The tactile control arrangement according to claim 12, wherein the connection between the sensor matrix and the processing means can be solved by uncoupling the connection by the multipolar flexible strip.

14. The tactile control arrangement according to claim 12, wherein the multipolar strip for the connection between the sensor matrix and the processing means includes a bundle of lines of excitation and reading of the sensors, a ground connection line, and a connection line to a shielding alternating voltage (AC_SHIELD).

15. The tactile control arrangement according to claim 1, wherein said processing means comprise a microcircuit programmed to generate a excitation voltage signal of the sensors shaped as a square wave at the frequency of 250 KHz, applied to the active sensor electrodes, and to acquire the signals of the voltage drop that is established at said active sensor electrodes.

16. The tactile control arrangement according to claim 1, wherein said processing means are arranged to be coupled to at least one electronic device via cable or via radio and to associate to each combination of signals of the sensor matrix a predetermined control function of said electronic device.

17. A flexible article, including a tactile control arrangement at least one electronic device according to claim 1.

18. An equipment, including a tactile control arrangement for at least one electronic device according to claim 1.

19. An item of clothing, including a tactile control arrangement for at least one electronic device according to claim 1.

* * * * *